US008803490B2

(12) United States Patent
Gomez

(10) Patent No.: US 8,803,490 B2
(45) Date of Patent: Aug. 12, 2014

(54) CURRENT-MODE ACTIVE TERMINATION

(75) Inventor: Ray (Ramon) Gomez, San Juan Cap, CA (US)

(73) Assignee: Broadcom Corporation, Irvine, CA (US)

(*) Notice: Subject to any disclaimer, the term of this patent is extended or adjusted under 35 U.S.C. 154(b) by 156 days.

(21) Appl. No.: 13/174,059

(22) Filed: Jun. 30, 2011

(65) Prior Publication Data

US 2013/0002225 A1   Jan. 3, 2013

(51) Int. Cl.
| | |
|---|---|
| G05F 1/70 | (2006.01) |
| G05F 3/00 | (2006.01) |
| H03F 1/56 | (2006.01) |
| H03F 3/24 | (2006.01) |
| H03K 19/0175 | (2006.01) |
| H03F 1/22 | (2006.01) |
| H03F 3/189 | (2006.01) |
| H03M 1/00 | (2006.01) |

(52) U.S. Cl.
CPC .. *H03F 1/22* (2013.01); *H03F 1/56* (2013.01); *H03F 3/245* (2013.01); *H03K 19/017545* (2013.01); *H03F 2200/387* (2013.01); *H03F 3/189* (2013.01); *H03M 1/00* (2013.01)
USPC .......................................... 323/208; 323/233

(58) Field of Classification Search
USPC .......... 323/208, 209, 210, 211, 315, 316, 328
See application file for complete search history.

(56) References Cited

U.S. PATENT DOCUMENTS

| | | | | |
|---|---|---|---|---|
| 3,160,767 | A * | 12/1964 | Tindall | 361/93.7 |
| 6,753,905 | B1 * | 6/2004 | Okada et al. | 348/211.14 |
| 6,965,722 | B1 * | 11/2005 | Nguyen | 385/147 |
| 7,254,380 | B2 * | 8/2007 | Kuei-Ann et al. | 455/313 |
| 7,269,212 | B1 * | 9/2007 | Chau et al. | 375/229 |
| 2004/0046516 | A1 * | 3/2004 | Uekawa | 318/98 |
| 2009/0273412 | A1 * | 11/2009 | Richards | 333/32 |
| 2010/0102886 | A1 * | 4/2010 | Onodera | 330/277 |

\* cited by examiner

*Primary Examiner* — Matthew Nguyen
*Assistant Examiner* — Trinh Dang
(74) *Attorney, Agent, or Firm* — Sterne, Kessler, Goldstein & Fox P.L.L.C.

(57) ABSTRACT

Embodiments of the present invention, as further described below, provide active termination circuits that can be used with power transmitter circuits. Embodiments reduce power loss due to impedance matching and increase power efficiency in power transmitter circuits. In particular, embodiments provide active termination circuits that can be configured to draw minimal amounts of the output current generated by the power transmitter circuits. At the same time, embodiments achieve optimal impedance matching, thus enabling optimal power transfer to the load. Further, embodiments can be controlled adaptively in real time to reduce parasitic effects on power transfer and to optimize impedance matching. Embodiments can be implemented using various transistor technologies (e.g., MOSFET, BJT, etc.), and can be used with a variety of power transmitter circuits, including, for example, power DACs, analog/digital RF transmitters, and analog/digital PAs.

20 Claims, 5 Drawing Sheets

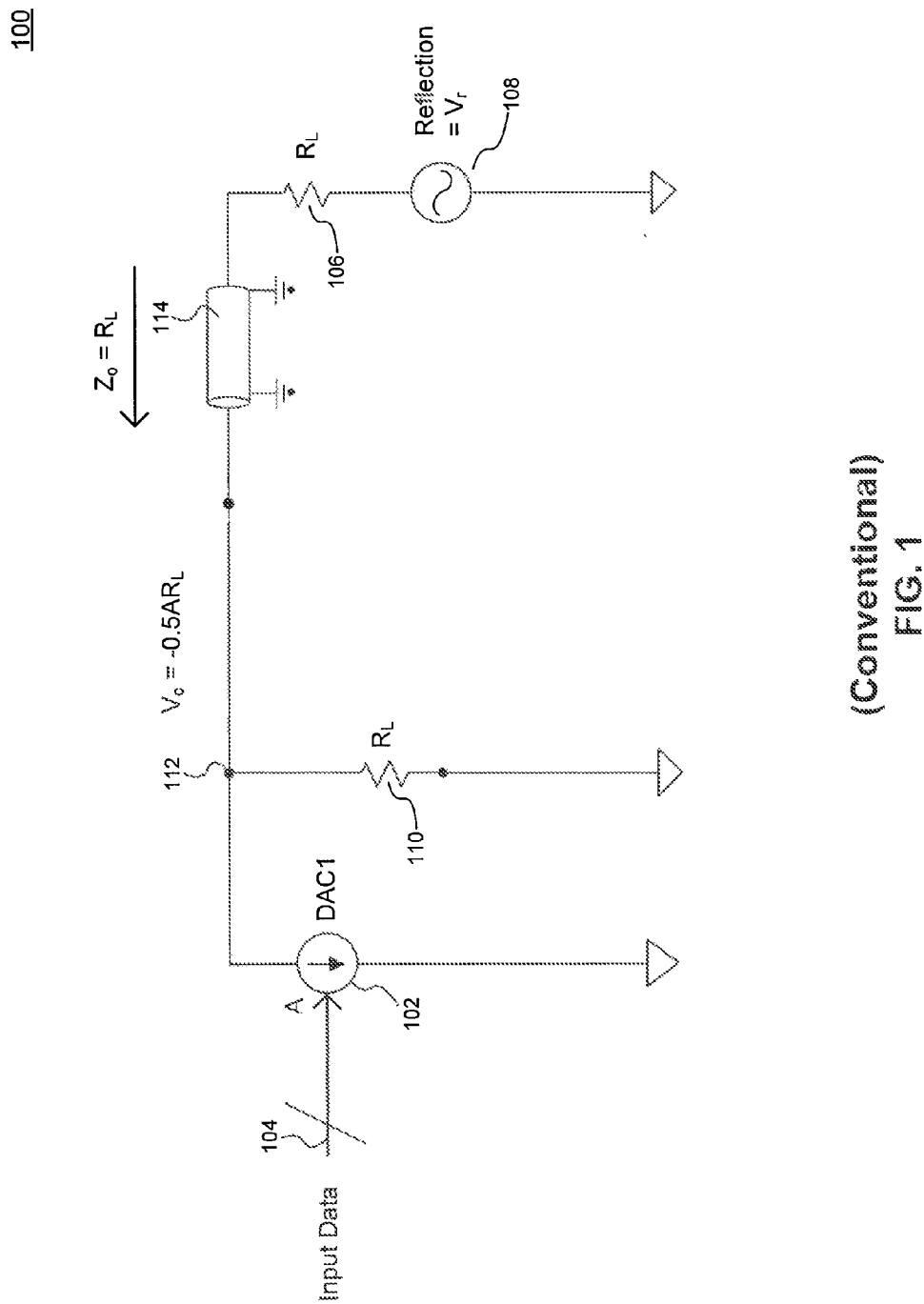
(Conventional)
FIG. 1

CURRENT-MODE ACTIVE TERMINATION

BACKGROUND

1. Field of the Invention

The present invention relates generally to load impedance matching.

2. Background Art

Power digital-to-analog converters (DACs), radio frequency (RF) transmitters, and power amplifiers (PAs) typically need to present a matched impedance to transmission lines or antennas that they drive. Poor matching (e.g., poor output return loss) may lead to unpredictable frequency response nulls and unpredictable output amplitude, which degrades reliability. Additionally, the performance of other components attached to the transmission medium may be adversely affected by a poorly-terminated source.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 1 is an example circuit with conventional passive back-termination.

The present invention will be described with reference to the accompanying drawings. Generally, the drawing in which an element first appears is typically indicated by the leftmost digit(s) in the corresponding reference number.

DETAILED DESCRIPTION OF EMBODIMENTS

Figure 2:
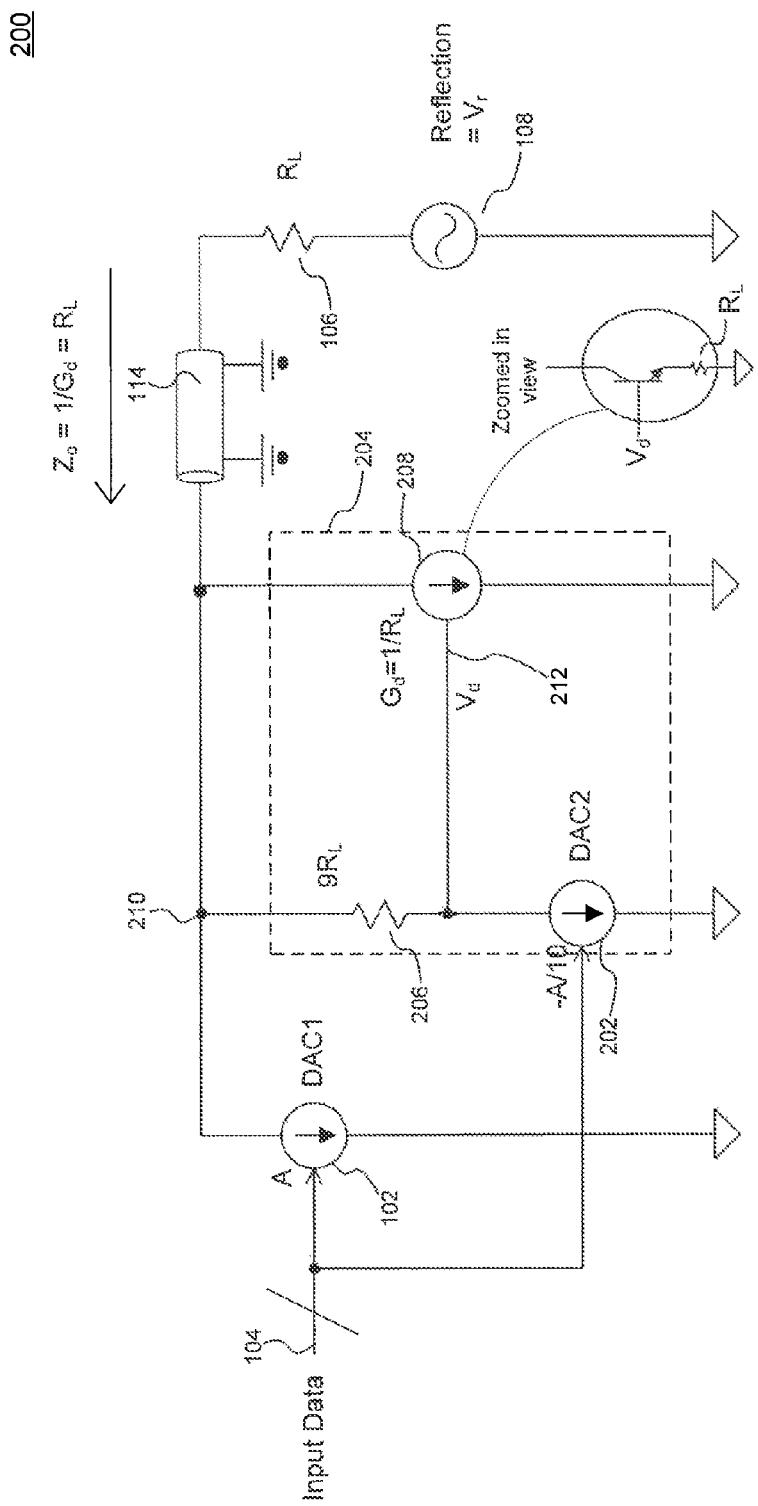
FIG. 2 is an example circuit with active termination according to an embodiment of the present invention.

Power transmitter circuits, including, for example, power digital-to-analog converters (Power DACs), radio frequency (RF) transmitters, and power amplifier (PAs), need to present a matched impedance to loads (e.g., transmission lines or antennas) that they drive. This requires that the output impedance of these circuits match the load impedance. Typically, however, such circuits are circuit equivalent of current sources with nearly infinite output impedance. As a result, back-termination is required in order to achieve load impedance matching.

FIG. 1 is an example circuit 100 with conventional passive back-termination. As shown in FIG. 1, example circuit 100 includes a DAC 102, which may be a power DAC. DAC 102 is controlled by digital input data 104. DAC 102 drives a load 106 (having an impedance $R_L$, typically around 75 Ohms) via a transmission line 114.

In order to achieve optimum power transfer from DAC 102 to load 106, the output impedance of DAC 102 must match as nearly as possible the impedance $R_L$ of load 106. Typically, however, DAC 102 is implemented using one or more current sources, and thus has nearly infinite output impedance. In other words, voltage reflected from load 106, illustrated as V, 108 in FIG. 1, would experience nearly infinite impedance in the direction of DAC 102.

One conventional approach for reducing the output impedance of DAC 102 is known as passive back-termination. Passive back-termination, as illustrated in FIG. 1, includes coupling a pull down resistor 110, with impedance matched to the load impedance, between the output of DAC 102 and ground. Because the output impedance of DAC 102 is very high compared to the impedance of resistor 110, the output impedance of the resulting circuit (DAC 102 and pull down resistor 110) is substantially equal to the pull down resistor 110, which matches the load impedance 106.

Although impedance matching can be achieved using passive back-termination, the approach suffers greatly in terms of power efficiency. Specifically, because resistor 110 is matched to load 106, the output current of DAC 102 divides nearly equally between resistor 110 and load 106. As such, a power loss of 6 dB is incurred, and the termination efficiency is only 25% ($0.5^2$).

Embodiments of the present invention, as further described below, provide active termination circuits that can be used with power transmitter circuits. Embodiments reduce power loss due to impedance matching and increase power efficiency in power transmitter circuits. In particular, embodiments provide active termination circuits that can be configured to draw minimal amounts of the output current generated by the power transmitter circuits. At the same time, embodiments achieve optimal impedance matching, thus enabling optimal power transfer to the load. Further, embodiments can be controlled adaptively in real time to reduce parasitic effects on power transfer and to optimize impedance matching. Embodiments can be implemented using various transistor technologies (e.g., MOSFET, BJT, etc.), and can be used with a variety of power transmitter circuits, including, for example, power DACs, analog/digital RF transmitters, and analog/digital PAs.

In the following, example embodiments will be provided for the purpose of illustration. These examples describe embodiments used mainly with power DACs. Embodiments are not limited by the examples provided herein. As described above, embodiments can be used with any power transmitter circuits, digital or analog. Further, as would be understood by a person of skill in the art based on the teachings herein, embodiments are not limited by the example circuit implementations provided in the examples described herein. In particular, a person of skill in the art would appreciate that active termination circuits, according to embodiments, can be implemented using a variety of other circuit implementations and component numerical values.

FIG. 2 is an example circuit 200 with active termination according to an embodiment of the present invention. For the sake of illustration only, example circuit 200 is modified from example circuit 100 described above by replacing the conventional passive back-termination with active termination according to an embodiment of the present invention. As such, like example circuit 100, example circuit 200 includes a DAC 102 that drives a load 106 via a transmission line 114. Embodiments are not limited by the examples provided herein. For example, DAC 102 may be replaced by any other power transmitter circuit according to embodiments.

As shown in FIG. 2, DAC 102 includes an input terminal for receiving an input signal 104. DAC 102 generates an output current through an output terminal 210 based on input data 104.

Example circuit 200 further includes an active termination circuit 204. Active termination circuit 204 is coupled to output terminal 210 of DAC 102. In an embodiment, as shown in FIG. 2, active termination circuit 204 includes a resistor 206, a first controlled current source 202, and a second controlled current source 208.

Resistor 206 has a first end and a second, the first end coupled to output terminal 210 of DAC 102. First controlled current source 202 includes first, second, and third terminals, the first terminal coupled to input signal 104, the second terminal coupled to the second end of resistor 206, and the third terminal coupled to ground. Second controlled current source 208 has first, second, and third terminals, the first terminal coupled to the second end of resistor 206, the second terminal coupled to output terminal 210 of DAC 102, and the third terminal coupled to ground.

As would be understood by a person of skill in the art based on the teachings herein, active termination circuits according to embodiments can be implemented using a variety of circuit implementations other than active termination circuit 204. For example, resistor 206 may be implemented as an impedance network of any type. Further, first and second controlled current sources 202 and 208 may be implemented in any known manner for implementing controlled current sources. In an embodiment, current sources 202 and 208 are digitally controlled DACs. Alternatively, current sources 202 and 208 are analog amplifiers, such as, metal oxide semiconductor (MOS) transistor amplifiers, for example.

According to embodiments, active termination circuit 204 is configured so as to draw only a small fraction of the output current generated by DAC 102, thereby increasing the power efficiency of example circuit 200. In an embodiment, the fraction of the output current drawn by active termination circuit 204 is determined by input signal 104 and is configured to increase transfer of the output current to load 106.

In an embodiment, resistor 206 and first controlled current source 202 are configured such that a voltage $V_d$ 212 at the first terminal of second controlled current source 208 has zero or near zero alternating current (AC) component. Since the first terminal is the control terminal, zero or near zero alternating current (AC) flows through second controlled current source 208, and the only AC current drawn by active termination circuit 204 (i.e., the fraction of the output current) is that generated by first controlled current source 202 and which is determined by input signal 104.

In an embodiment, the current generated by first controlled current source 202 is configured to be a specified fraction of the output current generated by DAC 102. In an embodiment, first controlled current source 202 is matched to DAC 102 according to a pre-determined ratio, which corresponds to the ratio of the fraction of the output current to be generated by current source 208 to the output current generated by DAC 102. For example, in circuit 200, DAC 102 and first controlled current source 202 (which may also be a DAC) are matched according to a 10:1 ratio, such that the current generated by first controlled current source 202 is ⅟₁₀ the current generated by DAC 102. As such, the termination efficiency of circuit 200 is equal to 81% ($0.9^2$).

Resistor 206 is selected based on the current generated by first controlled current source 202, so as to cause voltage $V_d$ 212 at the first terminal of second controlled current source 208 to have zero or near zero alternating current (AC) component. For example, in circuit 200, with current source 202 drawing ⅟₁₀ of the output current "A" of DAC 102, the current flowing through load 106 is equal to $-0.9 \times A$. As such, the voltage at output terminal 210 of DAC 102 is equal to $-0.9 \times A \times R_L$. To force voltage $V_d$ 212 to zero, resistor 206 is selected to be equal to $9 \times R_L$ such that a voltage potential of $+0.9 \times A \times R_L$ ($0.1A \times R_L$) is produced across resistor 206.

According to embodiments, the output impedance of DAC 102 and active termination circuit 204, determined at output terminal 210, substantially matches the load impedance $R_L$. The output impedance is primarily determined by second controlled current source 208. In an embodiment, second controlled current source 208 is implemented as shown in FIG. 2 (or as a diode-connected transistor) so as to have an output impedance equal to the load impedance $R_L$.

Figure 3:
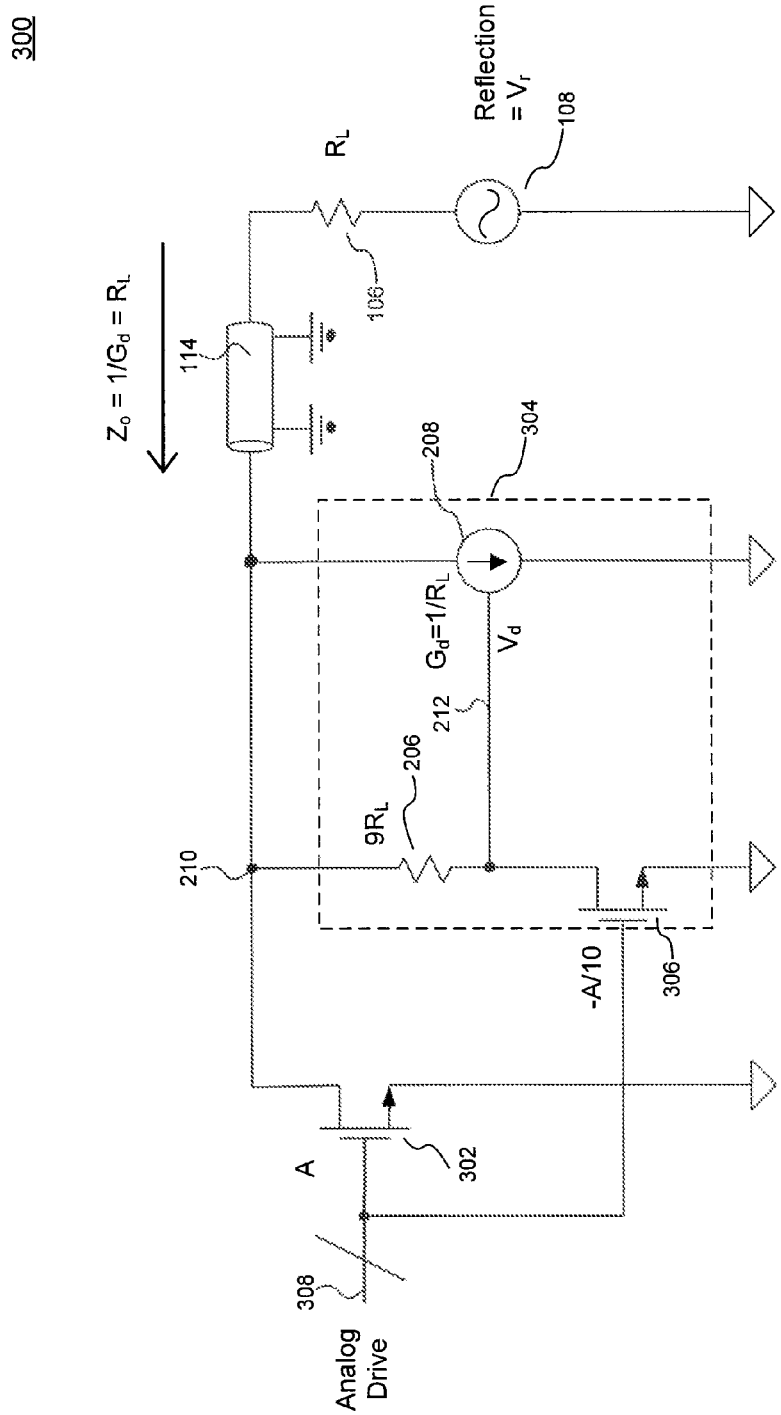
FIG. 3 is another example circuit with active termination according to an embodiment of the present invention.

FIG. 3 is another example circuit 300 with active termination according to an embodiment of the present invention. As shown in FIG. 3, example circuit 300 includes a MOS transistor amplifier 302 that drives a load 106 via a transmission line 114. Example circuit 300 also includes an active termination circuit 304.

Active termination circuit 304 is coupled to output terminal 210 of MOS transistor amplifier 302. In an embodiment, as shown in FIG. 3, active termination circuit 304 includes a resistor 206, a MOS transistor amplifier 306, and a second controlled current source 208.

MOS transistor amplifiers 302 and 306 are driven by an analog signal 308. In an embodiment, MOS transistor 306 is driven by an inverted version of signal 308. An inverted version of signal 308 may be obtained from an opposite side of the active termination circuit in a differential implementation. Alternatively, signal 308 may be inverted using an inverting amplifier, for example, to generate the inverted version of signal 308. In an embodiment, MOS transistor amplifiers 302 and 306 are matched according to a ratio that corresponds to a ratio of the currents generated by MOS transistors 302 and 304.

Example circuit 300 is functionally similar to example circuit 200 described above. In particular, active termination circuit 304 is configured so as to draw only a small fraction of the output current generated by MOS transistor amplifier 302, thereby increasing the power efficiency of example circuit 300. In an embodiment, the fraction of the output current drawn by active termination circuit 304 is determined by analog signal 308 and is configured to increase transfer of the output current to load 106.

In an embodiment, resistor 206 and MOS transistor amplifier 306 are configured such that a voltage $V_d$ 212 at the first terminal of second controlled current source 208 has zero or near zero alternating current (AC) component. As such, zero or near zero alternating current (AC) flows through second controlled current source 208, and the only AC current drawn by active termination circuit 304 (i.e., the fraction of the output current) is that generated by first controlled current source 202 and which is determined by analog signal 308.

Figure 4:
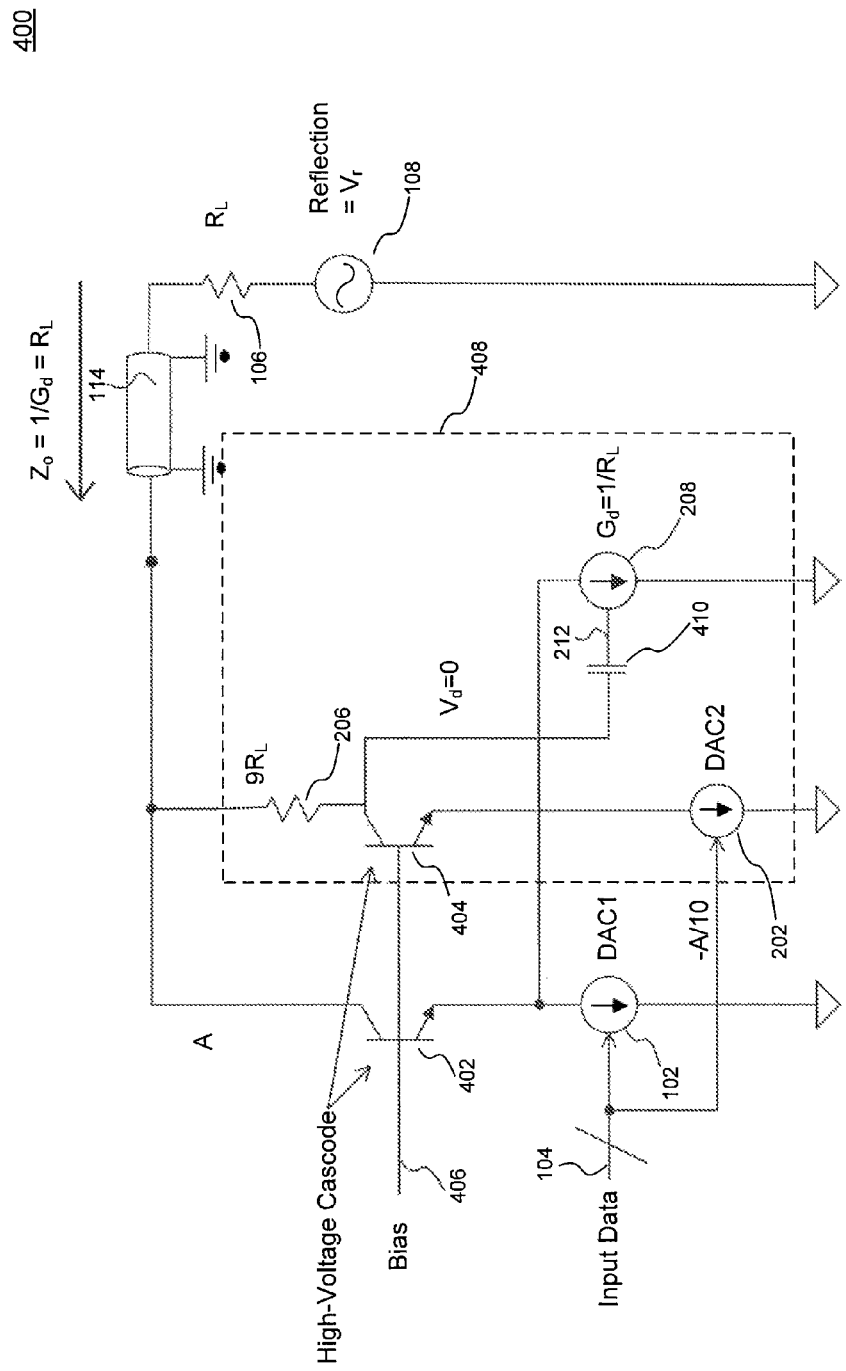
FIG. 4 is another example circuit with active termination according to an embodiment of the present invention.

FIG. 4 is another example circuit 400 with active termination according to an embodiment of the present invention. Example circuit 400 is similar to circuit 200 described above with reference to FIG. 2. Example circuit 400 includes a DAC 102 that drives a load 106 via a transmission line 114. An active termination circuit 408 is coupled to an output terminal of DAC 102.

Example circuit 400 is designed for high power applications. As such, as shown in FIG. 4, BJT (Bipolar Junction Transistor) amplifiers 402 and 404 are placed, respectively, in a cascode configuration with DAC 102 and first controlled current source 202 of active termination circuit 408. BJT amplifiers 402 and 404 are biased appropriately using a bias signal 406 in order to support the currents being generated by DAC 102 and first controlled current source 202, respectively. A capacitor 410 is placed between the second end of resistor 206 and the first terminal of second controlled current source 208 (instead of direct coupling) in order not to disturb the bias of BJT amplifiers 402 and 404.

As in example circuit 200, resistor 206 and first controlled current source 202 are configured such that a voltage $V_d$ 212 at the first terminal of second controlled current source 208 has zero or near zero alternating current (AC) component. As such, zero or near zero alternating current (AC) flows through second controlled current source 208, and the only AC current drawn by active termination circuit 408 is that generated by first controlled current source 202.

Figure 5:
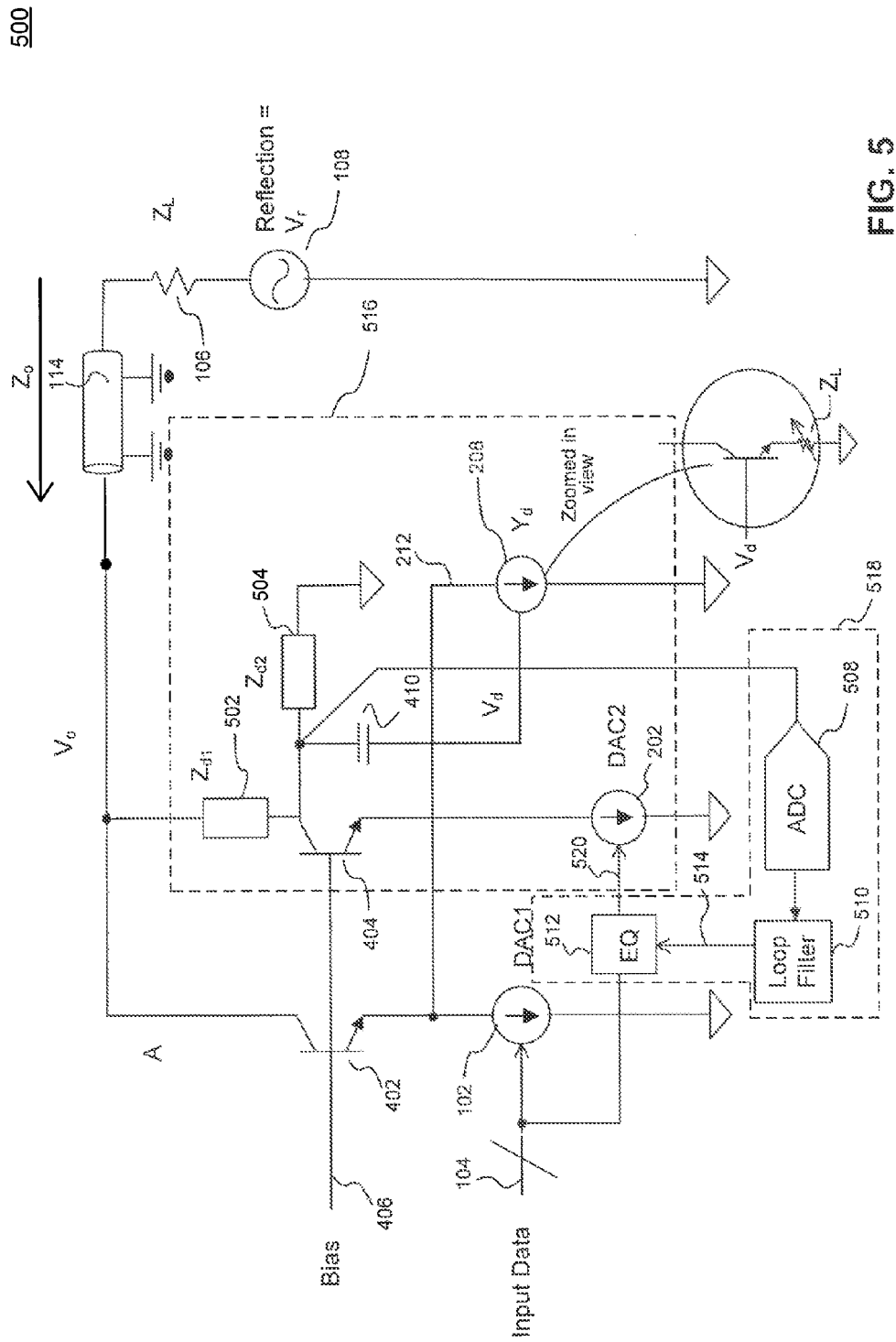
FIG. 5 is another example circuit with active termination according to an embodiment of the present invention.

FIG. 5 is another example circuit 500 with active termination according to an embodiment of the present invention. Example circuit 500 is similar to circuit 400 described above with reference to FIG. 4. Example circuit 500 includes a DAC 102 that drives a load 106 via a transmission line 114. An active termination circuit 516 is coupled to an output terminal of DAC 102.

Active termination circuit 516 is similar to active termination circuit 408 described above. In one variation, active termination circuit 516 includes impedances 502 and 504, which replace resistor 206. Impedances 502 and 504 are selected to tailor and/or optimize the overall frequency-dependent output impedance and frequency response of the circuit as desired.

Further, example circuit 500 includes a monitoring circuit 518 configured to monitor voltage $V_d$ 212 at the first terminal of second controlled current source 208 and to adjust the input signal provided at the first terminal of first controlled current source 202 to maintain the AC component of voltage $V_d$ 212 at zero or near zero.

In an embodiment, monitoring circuit 518 includes an analog-to-digital converter (ADC) 508, a loop filter 510, and an equalizer 512. ADC 508 measures voltage $V_d$ 212 at the first terminal of second controlled current source 208 and converts the measured voltage from analog to digital. Loop filter 510 filters the output of ADC 508 and outputs a signal 514 to equalizer 512. Based on signal 514, equalizer 512 acts on input signal 104 to generate an adjusted input signal 520 accordingly. The adjusted input signal 520 is then applied to first controlled current source 202, to vary the current generated by first controlled current source 202 and bring voltage $V_d$ 212 closer to zero.

According to embodiments, the monitoring circuit can be used to eliminate the effects of parasitic components in active termination circuit 500, which may cause voltage $V_d$ 212 to be different than zero. In addition, the monitoring circuit can be used to enhance impedance matching. For example, when changes occur in the impedance of load 106, voltage $V_d$ 212 can be expected to drift away from zero. As such, the monitoring circuit can be used to detect changes in the impedance of load 106 and to adjust the output impedance of active termination circuit 516 to match the load impedance. In an embodiment, as shown in FIG. 5, for example, second controlled current source 208 is implemented as a diode-connected transistor with a variable impedance in series. As such, the variable impedance can be adjusted to adjust the output impedance of active termination circuit 516.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present invention should not be limited by any of the above-described exemplary embodiments, but should be defined only in accordance with the following claims and their equivalents.

What is claimed is:

1. A device, comprising:
a power transmitter circuit, having an input terminal and an output terminal, configured to receive an input signal at the input terminal and to generate an output current through the output terminal;
a load having a load impedance, coupled to the output terminal of the power transmitter circuit; and
an active termination circuit coupled to the output terminal of the power transmitter circuit, the active termination circuit comprising:
a resistor having a first end and a second end, the first end coupled to the output terminal of the power transmitter circuit;
a first controlled current source, coupled to the second end of the resistor, configured to draw a fraction of the output current generated by the power transmitter circuit; and
a second controlled current source, coupled to the output terminal of the power transmitter circuit, having a control terminal coupled to the second end of the resistor and configured to draw zero current.

2. The device of claim 1, wherein the resistor and the second controlled current source are configured such that an output impedance of the power transmitter circuit and the active termination circuit, determined at the output terminal, substantially matches the load impedance.

3. The device of claim 1, wherein the second controlled current source is configured to have an output impedance, determined at the output terminal, that is substantially equal to the load impedance.

4. The device of claim 1, wherein the power transmitter circuit is a digital circuit, and wherein the input signal is a digital code.

5. The device of claim 1, wherein the power transmitter circuit is an analog circuit, and wherein the input signal is an analog drive signal.

6. The device of claim 1, wherein the power transmitter circuit is a power digital-to-analog converter (DAC), a radio frequency (RF) transmitter, or a power amplifier (PA).

7. The device of claim 3, wherein the first controlled current source is configured to receive the input signal and to generate said fraction of the output current based on the input signal.

8. The device of claim 3, wherein the first controlled current source is matched to the power transmitter circuit according to a ratio of said fraction of the output current to the output current.

9. The device of claim 3, wherein the resistor is configured such that a voltage at the control terminal of the second controlled current source has a zero or near zero alternating current (AC) component.

10. The device of claim 3, wherein the resistor and the first controlled current source are configured such that zero alternating current flows through the second controlled current source.

11. The device of claim 3, wherein the power transmitter circuit and the first controlled current source include digital-to-analog converters.

12. The device of claim 3, wherein the power transmitter circuit and the first controlled current source include MOS transistors.

13. The device of claim 3, wherein the second controlled current source is implemented as a diode-connected transistor.

14. The device of claim 9, further comprising:
a monitoring circuit configured to monitor said voltage at the control terminal of the second controlled current source and to adjust an input signal of the first controlled current source to maintain the AC component of said voltage at zero or near zero.

15. A termination circuit, comprising:
a resistor having a first end and a second end, the first end coupled to an output terminal of a power transmitter circuit;
a first controlled current source having first, second, and third terminals, the first terminal coupled to an input signal of the power transmitting circuit, the second terminal coupled to the second end of the resistor, and the third terminal coupled to ground; and
a second controlled current source having first, second, and third terminals, the first terminal coupled to the second end of the resistor, the second terminal coupled to the output terminal of the power transmitter circuit, and the third terminal coupled to ground,
wherein the resistor and the first controlled current source are configured such that zero current flows through the second controlled current source.

16. The termination circuit of claim 15, wherein the resistor and the first controlled current source are configured such that a voltage at the first terminal of the second controlled current source has a zero or near zero alternating current (AC) component.

17. The termination circuit of claim 15, wherein the termination circuit is configured to draw a fraction of an output current generated by the power transmitter circuit, said fraction of the output current determined by the input signal and configured to increase transfer of the output current to a load.

18. A device, comprising:
a transmitter configured to generate an output current based on an input signal;
a load, having a load impedance, coupled to an output terminal of the transmitter; and
an active termination circuit, coupled to the output terminal of the transmitter, the active termination circuit comprising:
a first current source, controlled by the input signal configured to draw a portion of the output current of the transmitter; and
a second current source configured to have an output impedance, determined at the output terminal of the transmitter, that is substantially equal to the load impedance.

19. The device of claim 18, wherein the active termination circuit further comprises:
a resistor configured, Lased on the portion of the output current drawn by the first current source, to cause the second current source to draw zero or near zero current.

20. The device of claim 19, wherein the resistor and the second controlled current source are further configured such that a combined output impedance of the transmitter and the active termination circuit, determined at the output terminal of the transmitter, substantially matches the load impedance.

* * * * *

UNITED STATES PATENT AND TRADEMARK OFFICE
CERTIFICATE OF CORRECTION

PATENT NO. : 8,803,490 B2  
APPLICATION NO. : 13/174059  
DATED : August 12, 2014  
INVENTOR(S) : Ray Ramon Gomez Page 1 of 1

It is certified that error appears in the above-identified patent and that said Letters Patent is hereby corrected as shown below:

In The Specification

Column 8, line 28, please replace "Lased" with --based--.

Signed and Sealed this
Twenty-eighth Day of April, 2015

Michelle K. Lee
*Director of the United States Patent and Trademark Office*